(12) United States Patent
Nappez et al.

(10) Patent No.: US 9,268,094 B2
(45) Date of Patent: Feb. 23, 2016

(54) OPTICAL SIGNAL EMISSION SYSTEM

(71) Applicants: THALES, Neuilly-sur-Seine (FR); CENTRE NATIONAL DE LA RECHERCHE SCIENTIFIQUE, Paris (FR)

(72) Inventors: Thomas Nappez, Valence (FR); Philippe Rondeau, Allex (FR); Jean-Pierre Schlotterbeck, Rochefort-Samson (FR); Elise Ghibaudo, Grenoble (FR); Jean-Emmanuel Broquin, Grenoble (FR)

(73) Assignee: Thales, Courbevoie (FR)

( * ) Notice: Subject to any disclaimer, the term of this patent is extended or adjusted under 35 U.S.C. 154(b) by 334 days.

(21) Appl. No.: 13/938,982

(22) Filed: Jul. 10, 2013

(65) Prior Publication Data
US 2014/0119695 A1    May 1, 2014

(30) Foreign Application Priority Data

Jul. 13, 2012   (FR) .................................... 12 01997

(51) Int. Cl.
| | |
|---|---|
| *G02B 6/42* | (2006.01) |
| *G02B 6/26* | (2006.01) |
| *H01S 5/14* | (2006.01) |
| *H01S 3/063* | (2006.01) |
| *H01S 3/094* | (2006.01) |
| *H01S 3/0941* | (2006.01) |

(Continued)

(52) U.S. Cl.
CPC .............. *G02B 6/262* (2013.01); *H01S 3/0632* (2013.01); *H01S 5/141* (2013.01); *H01S 3/025* (2013.01); *H01S 3/09415* (2013.01); *H01S 3/094084* (2013.01); *H01S 3/2308* (2013.01)

(58) Field of Classification Search
None
See application file for complete search history.

(56) References Cited

U.S. PATENT DOCUMENTS

| | | | |
|---|---|---|---|
| 5,446,749 A | 8/1995 | Nighan et al. | |
| 6,137,820 A | 10/2000 | Maag et al. | |
| 6,174,748 B1 * | 1/2001 | Jeon et al. | 438/31 |

(Continued)

FOREIGN PATENT DOCUMENTS

WO    02065600 A2    8/2002

OTHER PUBLICATIONS

V. Donzella et al.; Ion-exchanged Er3+/Yb3+ co-doped waveguide amplifiers longitudinally pumped by broad area lasers; Optics Express: May 28, 2010; vol. 18, No. 12; US.

(Continued)

*Primary Examiner* — Tina Wong
(74) *Attorney, Agent, or Firm* — Michael J. Donohue; Davis Wright Tremaine LLP

(57) ABSTRACT

Optical system has a passive optical chip on the top surface with a first wave guide and a laser diode arranged on the edge of the chip. The chip has a reflecting structure on the top surface at the wavelength of the laser diode and a thin layer portion powered by the laser diode and covering a part of the first wave guide. The first wave guide input is linked to the laser diode, passing through the reflecting structure. The chip has a second wave guide on the top surface, a first coupler formed by two first portions of the first wave guide not covered by the thin layer portion and situated on either side of the thin layer portion along the optical path, and a second coupler formed by two second portions, respectively of the first and second wave guides, not covered by the thin layer portion.

9 Claims, 4 Drawing Sheets

(51) Int. Cl.
   *H01S 3/23* (2006.01)
   *H01S 3/02* (2006.01)

(56) References Cited

U.S. PATENT DOCUMENTS

| | | | | |
|---|---|---|---|---|
| 2003/0210725 A1* | 11/2003 | Prassas et al. | ......... | 372/50 |
| 2004/0105480 A1* | 6/2004 | Sidorin et al. | ......... | 372/97 |
| 2004/0258360 A1* | 12/2004 | Lim et al. | ......... | 385/43 |
| 2007/0230527 A1* | 10/2007 | Sakai et al. | ......... | 372/43.01 |
| 2008/0080808 A1* | 4/2008 | Tolshikhin et al. | ......... | 385/14 |
| 2010/0092128 A1* | 4/2010 | Okayama | ......... | 385/14 |
| 2014/0047585 A1* | 2/2014 | Hofrichter et al. | ......... | 850/56 |
| 2014/0199020 A1* | 7/2014 | Nappez et al. | ......... | 385/14 |

OTHER PUBLICATIONS

Thomas Nappez et al.; Broad-Area Laser Diode with stable single-mode output and wavelength stabilization; Integrated optics: Devices, Materials, and Technologies XVI; Proceedings of SPIE; Feb. 9, 2012; vol. 8264; France.

Lydie Onestas et al.; 980nm-1550nm vertically integrated duplexer for hybrid erbium-doped waveguid amplifiers on glass. Integrated Optics: Devices, Materials, and Technologies; Proceedings of SPI; Jan. 1, 2009; vol. 7218; France.

Takasi Hasegawa et al.; Polarization Independent Frequency Conversion by Fiber Four-Wave Mixing with a Polarization Diversity Technique; IEEE Photonics Technologies Letters; Aug. 5, 1993; vol. 5, No. 8; US.

\* cited by examiner

OPTICAL SIGNAL EMISSION SYSTEM

FIELD OF THE INVENTION

The present invention relates to an optical signal emission system, and notably high-gain optical amplifiers.

BACKGROUND OF THE INVENTION

Optical signal emission systems, or optical injectors, are known, for which the emission is at the same time stable, single-mode and single-frequency, for which the emission power is limited to a few tens of milliwatts.

This limitation is particularly strong around the wavelength of 1.55 µm, which is often employed for its ocular safety.

The applications which require a greater power, within a power range greater than an optical watt, have to use at least two amplification stages. A first amplification stage, or preamplifier, makes it possible to reach the power range required for an output signal which is then amplified by a second amplification stage so as to reach optical powers greater than a watt. These amplification stages each require a specific interface: a pump source, a cooler, a mixer, a splitter and possibly a residual pump recycler.

The presence of these two amplification stages greatly increases the cost and the size of these emission systems and involves a large number of connections between components, which reduces the reliability and complicates maintenance.

The high-gain amplification of a single-mode signal is generally produced in guided optics by two well known embodiments, which both use laser diodes as pumps, thus exploiting their compactness and their reliability.

The first known embodiment consists of the use of a fibred single-mode pump laser diode. This embodiment allows for an effective amplification because its emission is matched to the emission of the amplifying medium. On the other hand, the pump power for an emitter is limited around the optical watt, limiting the length of the amplifying material and therefore the overall gain of the amplifier. In order to obtain a high-gain amplification, several of these pump laser diodes must be used, which reduces the compactness and increases the cost, in terms of purchase price of the pumps and the electrical consumption needed to cool each of the pumps.

The second known embodiment involves using one or more wide-strip laser diodes and matching the amplifying medium to the multimode emission of the pump laser diode. There are double-core optical fibres in which only a narrow central cylinder is active. Thus, it is possible to generate a single-mode signal around this region while the pump wave is guided in the wide cylindrical part surrounding the narrow active central cylinder. However, the weak interaction between the multimode pump and the single-mode signal of such an embodiment makes it necessary to have a long length of optical fibre in order to obtain a significant overall gain.

Moreover, the optical amplifiers require a mixer at the input and a splitter at the output between the pump and the signal. Produced more often than not by fusion-drawing between two optical fibres, these components reduce the compactness of the amplification modules.

Furthermore, it is sometimes proposed to produce the pump on each side of the amplifying medium in order to obtain a uniform pumping, limiting the possible stray effects due to an excessively high power density in the active medium. However, the residual pump power which leaves on either side of the amplifying medium may be coupled in each of the laser diodes. Their emission is disturbed, the emitted power and the wavelength may then substantially vary over time. These disturbances increase the additional noise of the amplifier. It may then prove necessary to use a costly fibred optical isolator at the output of each pump laser diode.

Also, the known embodiments for high-gain amplification lack compactness. This limitation is due to the pumps available. In the case of single-mode laser diodes, a number of separate emitters have to be used, and in the case of multimode laser diodes, a length of several meters of amplifying medium must be employed. Furthermore, the addition of mixer, splitter and isolator integrated on optical fibre contributes to the lack of compactness of the system.

SUMMARY OF THE INVENTION

One aim of the invention is to remedy the abovementioned problem, and notably propose a compact amplification system and a high gain.

Therefore, there is proposed, according to one aspect of the invention, an optical signal emission system comprising a passive optical chip provided on the top surface with a first wave guide, and a wide-strip laser diode arranged on the edge of the passive optical chip. The passive optical chip is provided, on the top surface, with a reflecting structure at the wavelength of the wide-strip laser diode and with an active or non-linear thin layer portion powered by said laser diode and covering a part of the first wave guide. The first wave guide being linked by its input end to the laser diode, passing through the reflecting structure, and comprising a transition between a wide input of the first wave guide arranged at the output of the laser diode and a narrow portion of the first wave guide passing through the reflecting structure. The passive optical chip is provided on the top surface with a second wave guide, a first coupler formed by two first portions of the first wave guide not covered by the thin layer portion and situated on either side of the thin layer portion along the optical path, and a second coupler formed by two second portions, respectively of the first and second wave guides, not covered by the thin layer portion.

Such a system makes it possible to have both a high gain and a great compactness. The increased compactness additionally results in a better robustness to vibratory environments.

In one embodiment, the input and output ends of the first and second wave guides opening out on an edge of the passive optical chip are arranged on one and the same edge of the passive optical chip.

Thus, the number of facets that have to be polished, and therefore the cost of the system, is minimized.

According to one embodiment, the input and output ends of the first and second wave guides opening out on an edge of the optical chip are arranged at a distance from the laser diode.

Thus, the input and output ends of the first and second wave guides are separated from the heat source represented by the laser diode, minimizing the thermal constraints at the couplings with the optical fibres for inserting the signal and extracting the amplified signal and consequently increasing the reliability of the component.

In one embodiment, the passive optical chip is provided on the top surface with a third wave guide, a third coupler formed by two third portions, respectively of the second and third wave guides, not covered by the thin layer portion, and a balanced detection module linked to the output ends of the second and third wave guides on the edge of the passive optical chip.

Thus, it is possible to obtain a balanced heterodyne detection whose main advantage is the elimination of the components due to the variations of intensity of the local oscillator wave conveyed by the third wave guide in the electrical signal obtained at the output of the detector. The great compactness of the module that is obtained allows for a better stability of the balancing and allows for a better rejection of the stray components up to high frequencies.

According to one embodiment, the part of the first wave guide, covered by the thin layer portion, is wound.

Thus, the bulk of the first wave guide is minimized and the complete component obtained can be produced on substrates of small dimensions.

For example, the radius of curvature at any point of the wound part of the first wave guide is greater than 1 mm.

Thus, the transmission losses of the wave guide are minimized for a containment of the guided wave allowing such radii of curvature of the wave guide.

In one embodiment, the transition is adiabatic.

The use of an adiabatic transition makes it possible to increase the overall efficiency.

According to one embodiment, the laser diode comprises an output facet having undergone an anti-reflection treatment.

Thus, the reflection needed by said reflecting structure to lock said laser diode decreases and the power at the output of the wave guide passing through said reflecting structure is increased.

For example, said reflecting structure comprises a Bragg grating, a photonic crystal, a wave guide interruption, an inclined facet, or any other structure allowing for a contra-propagative optical reflection.

Thus, the light contained in the wave guide passing through the reflecting structure interacts with said reflecting structure, is reflected on itself and returns within said laser diode. Said laser diode is then locked onto the mode or modes supported by said narrow wave guide passing through said reflecting structure.

In the case of a spectrally-narrow reflection, the emission wavelength of said laser diode is stabilized on the spectral reflection of said reflecting structure.

DESCRIPTION OF THE DRAWINGS

The invention will be better understood on studying a few embodiments described as non-limiting examples and illustrated by the appended drawings in which.

DETAILED DESCRIPTION OF THE INVENTION

In all the figures, the elements that have the same references are similar.

Figure 1:
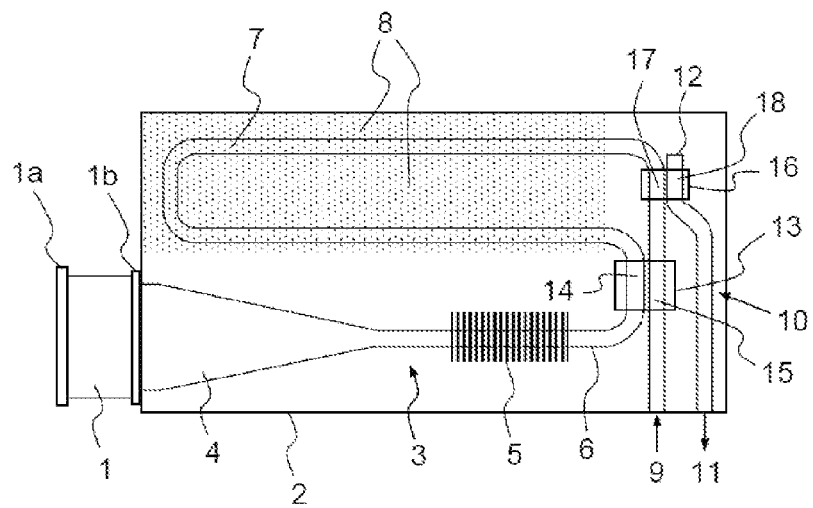
FIGS. 1 to 7 schematically illustrate a number of embodiments of a system according to various aspects of the invention.

As illustrated in FIG. 1, the optical signal emission system comprises a laser diode 1 provided with an input facet 1a and an output facet 1b mounted in contact on an input facet of a passive optical chip 2. The passive optical chip 2 comprises, on the top surface, a first wave guide 3 comprising a spreader or adiabatic transition 4 linked at the input to the output facet 1b of the laser diode 1, of narrow output, passing through a reflecting structure 5 at the wavelength of the wide-strip laser diode 1. This portion of the first wave guide 3 forms a modal transformer which is terminated by a single-mode wave guide 6.

Next, the first wave guide 3 comprises a part 7 covered by a thin layer portion 8, active or non-linear, powered by the laser diode 1. Then, after having passed through the thin layer portion 8, the first wave guide 3 continues and is terminated by an output end 9 opening out on an edge of the passive optical chip 2.

Furthermore, the passive optical chip 2 comprises, on the top surface, a second wave guide 10 comprising an input end 11 opening out on an edge of the passive optical chip 2 and an input end 12.

The passive optical chip 2 is provided, on the top surface, with a first coupler 13 formed by two first portions 14 and 15 of the first wave guide 3, not covered by the thin layer portion 8 and situated on either side of the thin layer portion 8 along the optical path, and with a second coupler 16 formed by two second portions 17 and 18, respectively of the first and second wave guides 3 and 10, not covered by the thin layer portion 8.

FIG. 1 illustrates the use of the first coupler 13 as pump/signal splitter. The signal to be amplified enters through the end 9 of the first wave guide 3 and leaves, after amplification, through the end 11 of the second wave guide 10.

Obviously, such an architecture also makes it possible to have the signal to be amplified enter through the end 11 of the second wave guide 10 and leave through the end 9 of the first wave guide 3.

The architecture represented in FIG. 1 is produced on the basis of a passive substrate 2 and an active substrate 8, both preferentially comprising glass.

The architecture represented shows three parts. The first part comprises the wide-strip laser diode 1, also called pump diode in the rest of the present document, and is coupled to the input of the modal transformer formed by the adiabatic transition 4 of the first wave guide 3 passing through the reflecting structure 5 ending with a portion as single-mode wave guide 6 at the pump and signal wavelengths on which is integrated the reflecting structure 5, for example a Bragg grating 5. The Bragg wavelength is chosen to be situated in the gain band of the pump diode 1 and in the absorption band of the active substrate 8. The Bragg grating 5 creates an external activity planar to the pump diode 1 and imposes a single-mode and wavelength-selective feedback within the pump diode 1. Thus, when the reflection from the Bragg grating 5 is chosen so as to impose the laser oscillation conditions on the pump diode 1, initially obtained by its input and output facets, an emission is obtained that is powerful, single-mode and stabilized at the wavelength of the pump diode 1, initially powerful but multimode. This first part also comprises the first coupler 13 of which two branches are linked to the second part.

Figure 2:
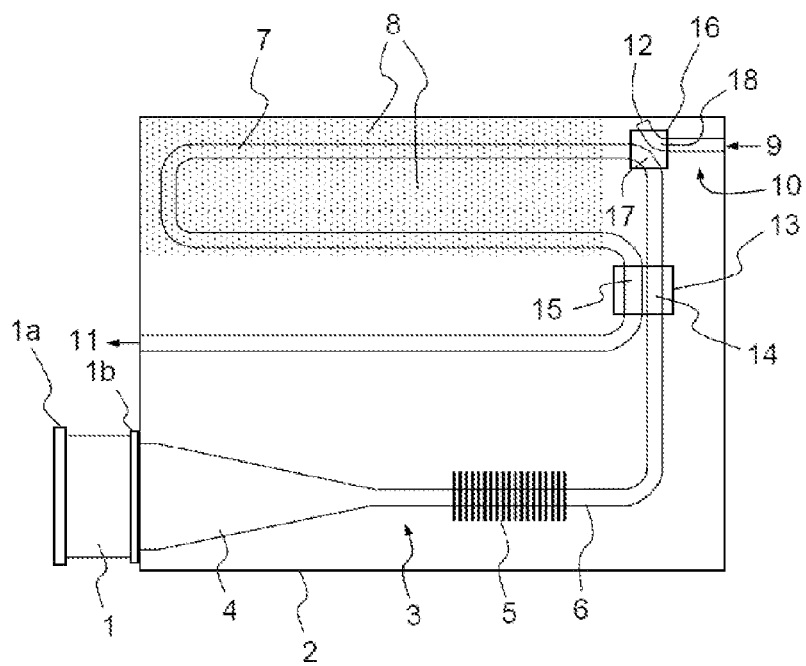

The second part comprises a portion 7 of the first wave guide 3, in this case a loop 7, linking the two output branches of the first coupler 13. The amplifying medium 8, or thin layer portion 8, active or non-linear and powered by the laser diode 1, is formed on a part of the loop 7. The amplifying medium 8 is preferentially a thin layer of an active glass transferred by molecular adhesion onto the passive substrate 2, allowing for hybrid guiding within the thin layer portion 8 where the portion 7 of the first wave guide 3 is present. The first coupler 13 is dimensioned to offer, on a simple outbound path, a coupling of 3 dB at the wavelength of the pump diode 1 locked by the Bragg grating 5. Thus, the pump wavelength is symmetrically injected into the amplifying guide consisting of the portion 7 of the first wave guide 3 in contact with the amplifying medium 8. Furthermore, the residual pump leaving on either side of the amplifying guide 7 and arriving on each of the branches of the first coupler 13 is entirely coupled into the branch through which it arrived. In practice, the two pump waves split by the first coupler have travelled the same optical path, so the phase-shift between them is due only to the phase shift induced by the first coupler 13. The two residual waves are therefore in phase quadrature on arriving at the first coupler 13 and all the power is therefore transmitted to the branch by which the pump is brought. Thus, the Bragg grating 5 makes it possible to recycle, to the extent of its reflectivity, the pump into the amplifying medium 8. When the facet 1b of the pump diode 1 has not undergone any anti-reflection treatment, the reflection of the Bragg grating 5 necessary to the locking of the laser diode 1 is significant. Thus, this strong reflectivity isolates the pump diode 1 from any light return while effectively recycling the residual pump into the amplifying medium 8. The first coupler 13 is also dimensioned to offer a complete transfer of the signal, as illustrated in FIG. 1, or, as a variant, as illustrated in FIG. 2, to offer no coupling from one branch to the other for the wavelength of the signal to be amplified. Thus, the first coupler 13 makes it possible, in the case of FIG. 1, to directly mix the pump and the signal, which makes it possible to avoid the presence of a component necessary to the amplification modules. On the other hand, furthermore, in the case of FIG. 2, the first coupler 13 makes it possible to directly split the pump from the signal, which also makes it possible to avoid the presence of a component necessary to the amplification modules. The end 11 of the second wave guide 10 therefore comprises only the amplified signal and constitutes the output of the signal.

The third part relates, in the case of FIG. 1, to the end 11 of the second wave guide, through which the amplified signal leaves, and its splitter, or second coupler 16, with the pump.

In the present description, the design of the couplers is such that it is simpler to consider them as black boxes linking two wave guides on one side to two wave guides on the other side (the terms inputs/outputs have no real meaning, but serve to differentiate the sides. The couplers are not oriented). Any wave arriving on a wave guide on one side of a coupler is divided into two waves on the two wave guides, on the other side, with a splitting coefficient and a phase (between the output which is facing the injection wave guide and that which is not facing) which depends on the characteristics of the coupler, on the polarization of the wave and on its wavelength. These couplers can therefore serve as mixers, splitters, or wavelength duplexers/splitters depending on the requirements. Within the coupler, the wave is not contained in its insertion guide.

In the case of FIG. 2, the third part relates to the end 9 through which the amplified signal enters, and its mixer, or second coupler 16, with the pump.

Figure 3:
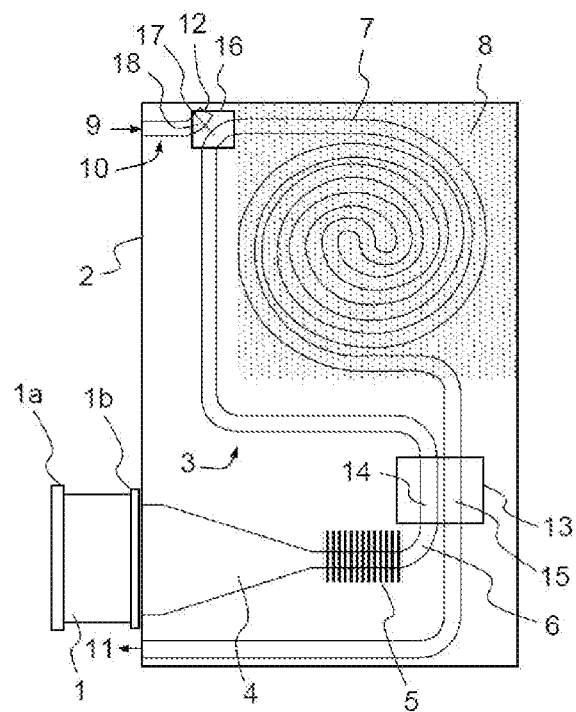
Figure 4:
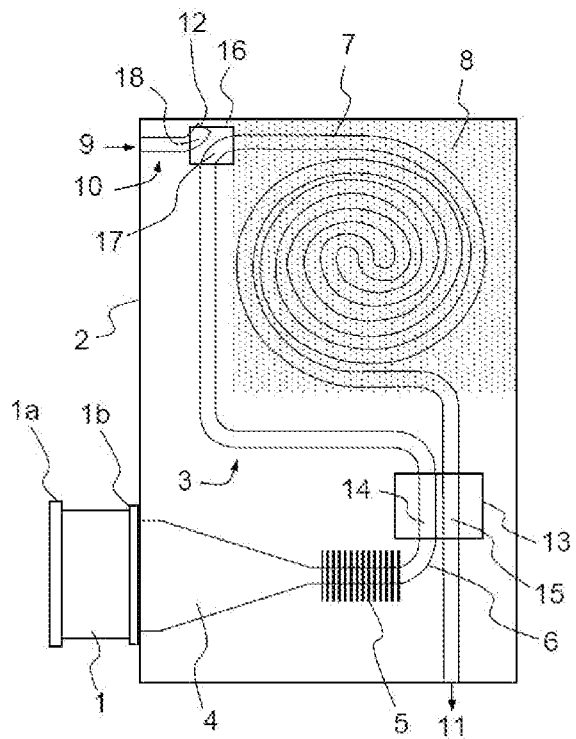
Figure 5:
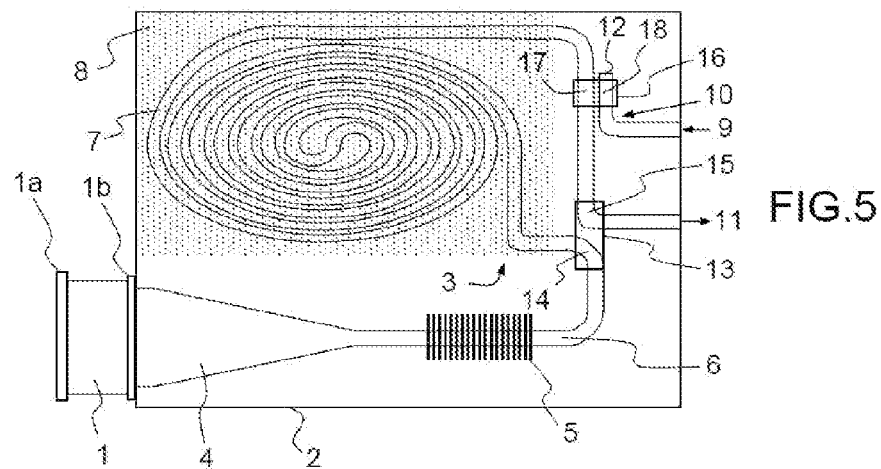

FIGS. 3, 4, and 5 illustrate embodiments that make it possible to increase the length of the amplifying medium.

As illustrated in FIG. 3, it is possible to wind the part 7 of the first wave guide 3 covered by the amplifying area 8, and thus very greatly increase the length of the amplifying medium. It is thus possible to dimension this length and the power supplied by the pump diode 1 so as to obtain a greater overall gain for the system.

The embodiment represented in FIG. 3 makes it possible to have the two signals to be injected (pump and amplified signal) as well as the output signal (amplified signal) situated on one and the same edge of the passive optical chip 2. The facets that need to be polished during the fabrication of the system are therefore minimized.

The embodiment represented in FIG. 4, in which the output of the amplification module system is situated on an edge of the passive optical chip 2 other than that comprising the diode pump laser diode 1, makes it easier to connect a fibre for the extraction of the amplified signal.

The embodiment represented in FIG. 5, in which the input and the output of the active medium 8 are placed on one and the same side of the active medium 8, which makes it possible to have a single side of the active medium 8 adapted to the transition between the active 8 and passive 2 media, and thus facilitate the production of the module.

In practice, in the part covered by the gain medium, the guide has to be on the surface for the wave to be able to interact with the gain medium 8 whereas, in the rest of the plate 3, the guides have to be buried (to limit the diffusion losses on the surface of the plate). The transition between the guide on the surface and the buried guide demands a special production method and it is simpler to have the two transitions on the same axis.

Figure 6:
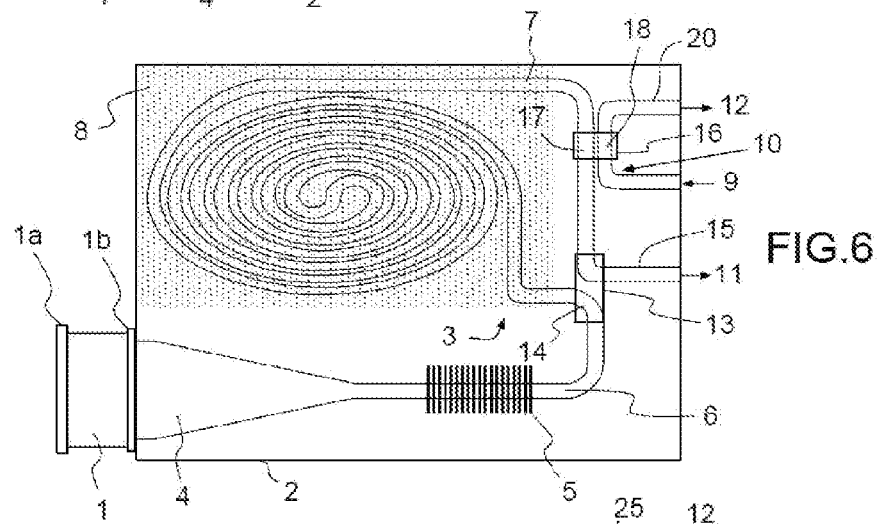
Figure 7:
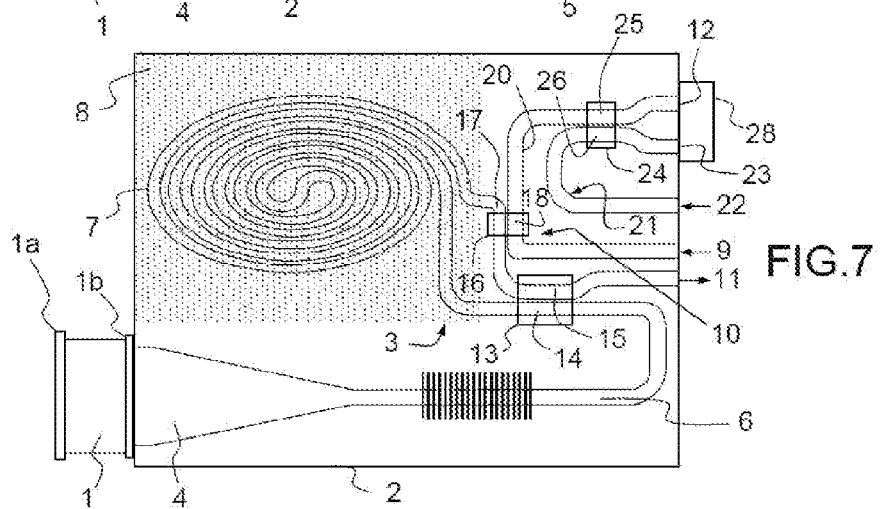

FIGS. 6 and 7 illustrate two embodiments that are particularly useful to remote laser detection or LiDAR, standing for "light detection and ranging".

In the embodiment of FIG. 6, a partial transfer of the input 9 of the signal to the amplifying medium 8 is used by virtue of the second coupler 16. A local oscillator channel 20 is then created by using the second coupler 16 that is already present.

In the embodiment of FIG. 7, there are added a third wave guide 21 of ends 22 and 23, a third coupler 24 formed by two third portions 25 and 26 respectively of the second wave guide 10 and of the third wave guide 21, and a balanced detector 26 to produce a self-heterodyne balanced detection. The ends 12 and 23 of the second and third wave guides 10 and 21 arrive at two photodiodes of the balanced detector 26.

The approaches and the spacings of the branches of the three couplers 13, 16 and 24 are identical, simplifying their dimensioning. The wound part 7 uses a technology allowing for a radius of curvature for the wave guides of up to 1 mm. The radius of curvature can vary as a function of the containment of the guided waves given by the technology employed. The greater the containment, the smaller the radius of curvature can be.

Preferentially, the passive glass can be a silicate glass, and the active glass can be a rare earth-doped phosphate glass.

In order to guarantee its adiabaticity, the length L of the transition 4 must satisfy the following criterion:

$$L \geq \frac{W^2}{\lambda^{m=0}}$$

in which W represents the width of the input of the transition 4 and $\lambda^{m=0}$ the wavelength of the fundamental mode in the medium.

If W=100 μm, $\lambda_0$=0.98 μm and $n_{eff}$=1.5, a transition length of L=2 cm is sufficient to satisfy this criterion.

The length of the Bragg grating 5 is conventionally approximately a centimeter, which brings the minimum extension of the chip 2 in the direction of the spreader 4 to 3 cm. For example, for a length of 4 cm, a radius of curvature of 4 mm avoids any radiation loss in the curves. By choosing a coupling length of 1 mm in the three couplers 13, 16 and 24, the area available for the amplifying medium 8 is 2 cm in the direction of the spreader 4, given the configuration employed in FIG. 6. When the winding is not very elliptical, the length of the amplifying medium formed by the winding 7 can be approximated by:

$$L_{act} = 2\pi R + \pi \sum_{n=1}^{n=N} \sqrt{2[(2R+ns)^2 + (R+ns)^2]}$$

with N being the number of turns and s the distance separating the neighbouring guides.

It is assumed that a separation s of 500 µm between each of the turns does not imply any coupling between them and leaves sufficient space to overcome any problem of heat dissipation in the system.

The 2 cm of the amplifying medium and this separation of 500 µm make it possible to obtain a length of amplifying guides 7 of 74 cm. The other axis of the ellipse then measures 2.8 cm. This long length of 74 cm is useful in the case where the active medium has only little absorption at the pump wavelength, as is the case for erbium-doped doped glass. However, in the case where the application targeted requires a more compact system, the phosphate glass is then codoped with erbium and ytterbium in order to increase the effective absorption section at the pump wavelength.

The calculation of the gain available when the system is produced by ion exchange on an erbium/ytterbium-doped phosphate glass can be performed as follows:

i) Three assumptions are posited:
the intrinsic propagation losses in the material at the pump and signal wavelengths are 0.1 dB/cm, ii) the intensity distribution of the mode of the pump in the active medium 8 has the form of a circular Gaussian of diameter 1/e with the value 4 µm, and iii) the intensity distribution of the mode of the signal is a Gaussian with a diameter of 8 µm.

The simulations are conducted for a pump injection on a single side of the system.

The results are presented for two amplifying lengths 7 compatible with the available space: 50 cm and 25 cm.

Figure 8:
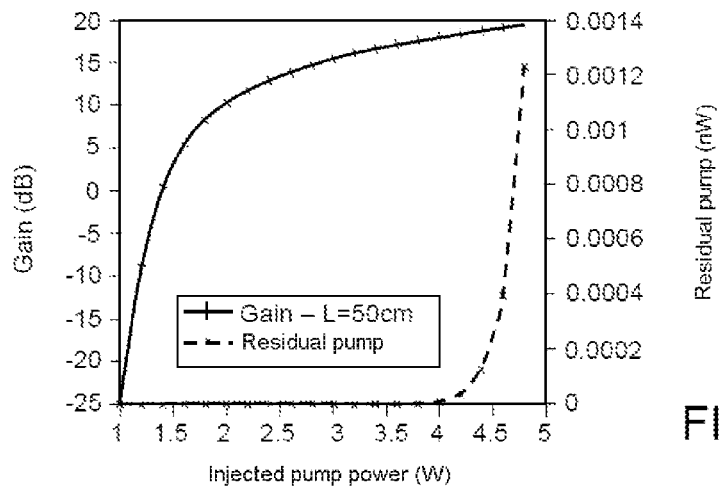
FIGS. 8 and 9 schematically illustrate the gain obtained as a function of power.
Figure 9:
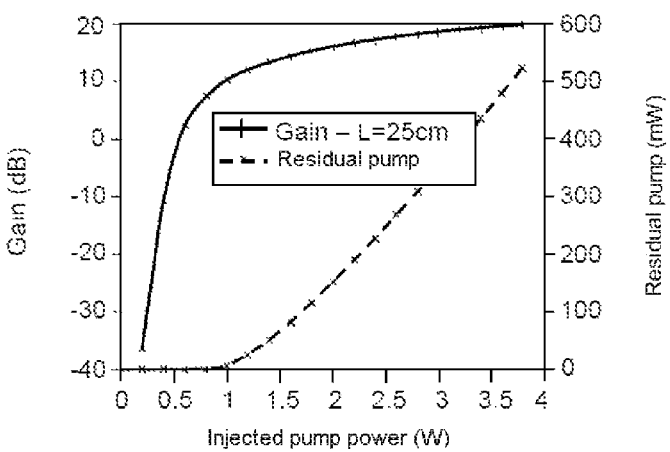

FIGS. 8 and 9 present the results of simulation of the gain obtained as a function of the pump power injected into the active medium 8 for a signal power at the input of 10 mW.

FIG. 7 relates to the length of amplifier guide 7 of 50 cm, and FIG. 8 relates to the length of amplifier guide 7 of 25 cm.

Given the pump powers currently available for a single pump laser diode, an amplifying guide length 7 of 50 cm is too great. In practice, a medium that long demands a pump power of more than 4.5 W in order to begin saturating the amplifier over the entire length of the amplifying guide 7.

A length of 25 cm is better suited. Thus, a pump power of 4 W gives a signal power at the output of 1 W for a power at the input of 10 mW.

For lower pump powers, the simulations show the benefit of this medium for amplifying lower input powers.

Figure 10:
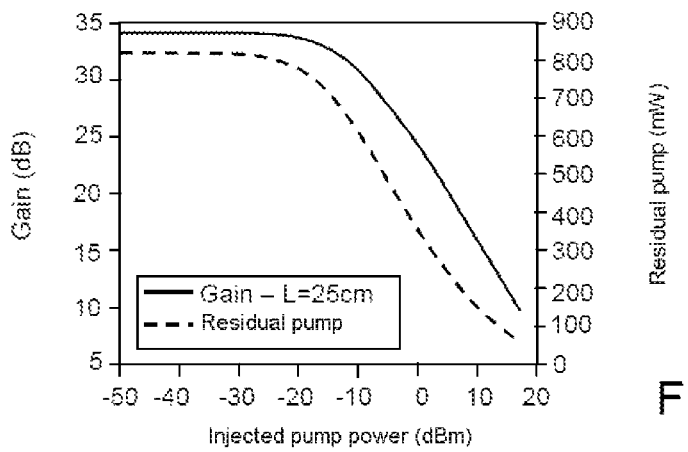
FIG. 10 schematically illustrates the gain as a function of signal power for a length of 25 cm and a 2 W pump.

FIG. 10 describes the trend of the gain as a function of the input signal power injected at the end 9 of the wave guide for a length of the amplifying guide 7 of 25 cm and a pump of 2 W. This calculation shows notably that an input power of 1 mW reaches 270 mW at the output of the amplifier system and that an input power of 1 µW gives 2.5 mW at the output.

This system can be used in fields for which a high-gain amplification is required and bulk constraints prohibit the use of the conventional solutions. It can also be applied when the aim is to avoid the presence of optical fibres, which are not very robust to mechanical vibrations and which can sometimes complicate maintenance.

Thus, the embedded systems, where bulk is an extremely important parameter, can include the invention, and in particular the remote laser detectors or LiDARs.

The methods used to implement the invention can make use of etched or diffused technologies depending on the constraints. If the aim is to be naturally compatible with the optical fibres, a diffused technology with low step index is preferred. If the aim is a natural compatibility with the pump laser diode, a technology with high step index is preferred.

In a preferred embodiment, ion exchange on glass technology, which makes it possible to satisfy both constraints, will be used.

The invention claimed is:

1. Optical signal emission system comprising a passive optical chip (2) provided on the top surface with a first wave guide (3), and a wide-strip laser diode (1) arranged on the edge of the passive optical chip (2), the passive optical chip (2) being provided, on the top surface, with a reflecting structure (5) at the wavelength of the wide-strip laser diode (1) and with an active or non-linear thin layer portion (8) powered by said laser diode (1) and covering a part (7) of the first wave guide (3), the first wave guide (3) being linked by its input end to the laser diode (1), passing through the reflecting structure (5), and comprising a transition (4) between a wide input of the first wave guide arranged at the output of the laser diode (1) and a narrow portion of the first wave guide (3) passing through the reflecting structure (5), the passive optical chip (2) being provided on the top surface with a second wave guide (10), a first coupler (13) formed by two first portions (14, 15) of the first wave guide (3) not covered by the thin layer portion (8) and situated on either side of the thin layer portion (8) along the optical path, and a second coupler (16) formed by two second portions (17, 18), respectively of the first and second wave guides (3, 10), not covered by the thin layer portion (8).

2. System according to claim 1, in which the input and output ends of the first and second wave guides (3, 10) opening out on an edge of the passive optical chip (2) are arranged on one and the same edge of the passive optical chip (2).

3. System according to claim 1, wherein the input and output ends of the first and second wave guides (3, 1) opening out on an edge of the optical chip (2) are arranged at a distance from the laser diode (1).

4. System according to claim 1, wherein the passive optical chip (2) is provided on the top surface with a third wave guide (21), a third coupler (24) formed by two third portions (25, 26), respectively of the second and third wave guides (10, 24), not covered by the thin layer portion (8), and a balanced detection module (26) linked to the output ends of the second and third wave guides (10, 24) on the edge of the passive optical chip (2).

5. System according to claim 1, wherein the part (7) of the first wave guide (3) covered by the thin layer portion (8), is wound.

6. System according to claim 5, wherein the radius of curvature of the wound part (7) of the first wave guide (3) is greater than 1 mm.

7. System according to claim 1, wherein the transition (4) is adiabatic.

8. System according to claim 1, wherein the laser diode (1) comprises an output facet (1*b*) having undergone an anti-reflection treatment.

9. System according to claim 1, wherein said reflecting structure (5) comprises a Bragg grating, a photonic crystal, a wave guide interruption, an inclined facet, or any other structure allowing for a contra-propagative optical reflection.

* * * * *